United States Patent [19]

Swirhun

[11] Patent Number: 5,461,244
[45] Date of Patent: Oct. 24, 1995

[54] FET HAVING MINIMIZED PARASITIC GATE CAPACITANCE

[75] Inventor: Stanley E. Swirhun, Boulder, Colo.

[73] Assignee: Honeywell Inc., Minneapolis, Minn.

[21] Appl. No.: 176,599

[22] Filed: Jan. 3, 1994

[51] Int. Cl.[6] .................... H01L 29/20; H01L 29/22
[52] U.S. Cl. .................... 257/192; 257/289; 257/195
[58] Field of Search ........................ 257/192, 195, 257/194, 289

[56] References Cited

U.S. PATENT DOCUMENTS 4,805,005  2/1989  Usagawa et al. ............... 257/195

FOREIGN PATENT DOCUMENTS 58-201375  11/1983  Japan ........................ 257/270
59-114873  7/1984  Japan ........................ 257/192

Primary Examiner—Jerome Jackson
Assistant Examiner—Donald L. Monin
Attorney, Agent, or Firm—John G. Shudy, Jr.

[57] ABSTRACT

A HIGFET having a gate pad situated over a non conducting portion of the channel layer of the heterostructure wafer. The method of producing this device involves application of a very thin layer of gate metal on the wafer to protect the wafer surface during further processing. A photoresist coating is formed over the active area of the channel layer of the FET. An ion isolation implantation is applied to the wafer resulting in a non conducting portion of the channel layer that is not covered by the photoresist layer. The photoresist layer is removed and a thick layer of gate metal is applied on the thin layer of gate metal. The gate layers are fashioned into a pad over the non conducting portion of the channel layer and at least one finger over the conducting portion of the channel layer, resulting in the gate having minimized parasitic gate capacitance.

3 Claims, 5 Drawing Sheets

5,461,244

FET HAVING MINIMIZED PARASITIC GATE CAPACITANCE

BACKGROUND OF THE INVENTION

The invention pertains to the fabrication of field effect transistors (FETs), particularly heterostructure FETs (HFETs). More particularly, the invention pertains to a self-aligned gate heterostructure insulated gate (HIG) FET having a parasitic capacitance between the gate pad and the remaining FET structure, and a method and structure for minimizing such capacitance.

In the related art there is a significant capacitance between the gate pad and the FET structure. Attempts to reduce that capacitance include ion implanting at the surface of the heterostructure wafer before the gate pad is formed. However, this results in the production of HFETs that are not adequate or uniform, especially relative to one another.

SUMMARY OF THE INVENTION

It is an object of the present invention to produce a heterostructure FET having a capacitance between the gate pad and the channel layer that is much less than similar type capacitances of related art FETs. This object is achieved by a process which utilizes an ion implant isolation of the channel layer beneath the gate pad without affecting or damaging the surface of the heterostructure wafer.

In the HIGFET fabrication method of the related art, the first step in the fabrication process includes the deposition of a single thick gate metal layer including the gate pad area. This layer is too thick to permit an ion isolation implantation to affect the FET channel in the heterostructure wafer. If the surface is ion isolation implanted prior to the deposition of the gate metal layer, then the wafer is affected in other ways that degrades the surface which results in poor quality FETs or a non-uniform group of FETs. However, in accordance with the invention, the gate metal deposition is accomplished in two separate steps, the first one of which is depositing thin gate metal layer that protects the surface of the wafer but still permits ion isolation implantation of the channel layer under the gate metal. The second deposition step is depositing, after the implantation, a thick gate metal layer to bring the gate and its pad to a thickness required for adequate conduction for satisfactory FET performance.

DESCRIPTION OF THE EMBODIMENT

Figure 1:
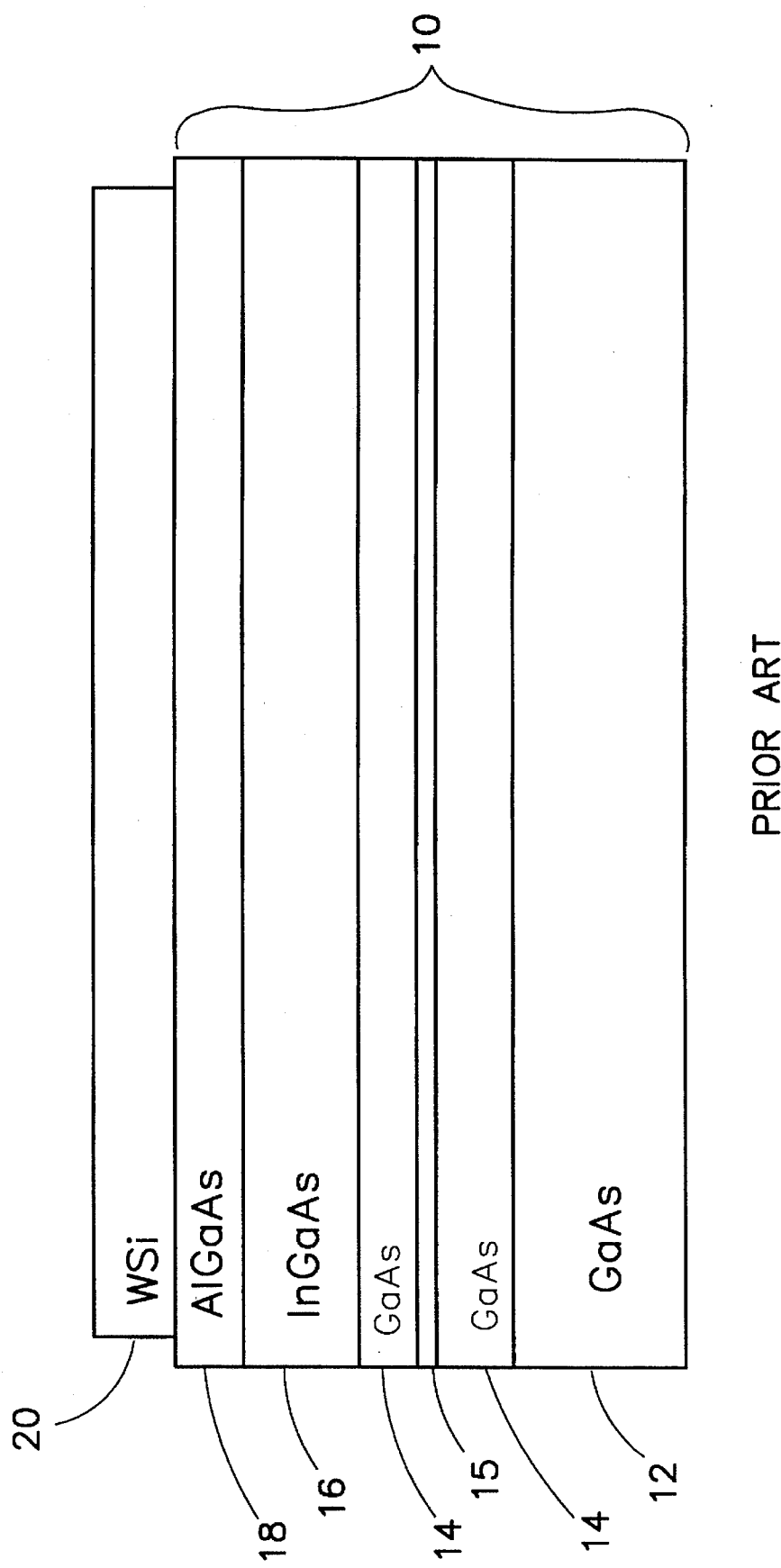
FIG. 1 is a cross-sectional view of a typical related art heterostructure wafer.

An insulated gate FET is fabricated on a heterostructure wafer 10 such as the one shown in FIG. 1. Wafer 10 is composed of a semi-insulating GaAs substrate 12, an unintentionally doped and therefore slightly less insulating buffer GaAs layer 14 with a "pulse" doping charge 15, an InGaAs channel layer 16, and an AlGaAs gate insulator layer 18. These layers, with the exception of layer 15, are not intentionally doped and have the attributes which are the same as those layers typically used in the related art for desired purposes. Layer 15 is a "pulsed doped layer" which is inserted into layer 14. Layer 15 is a "sheet" of dopant, typically Si, that is used to adjust the threshold of HIGFETs. Layer 15 is a fraction of a monolayer of Si dopant embedded in a single atomic layer. The typical dose of layer 15 is $1 \times 10^{11}$ to $1 \times 10^{12}$ per $cm^2$.

A typical thickness of layer 20 (WSi or W or WN or a combination) is 3000 to 10,000 angstroms; the thickness of layer 18 (AlGaAs) is 100 to 500 angstroms; the thickness of layer 16 (InGaAs) is 70 to 250 angstroms; and the thickness of layer 14 (GaAs) is 1000 to 10,000 angstroms.

Figure 2:
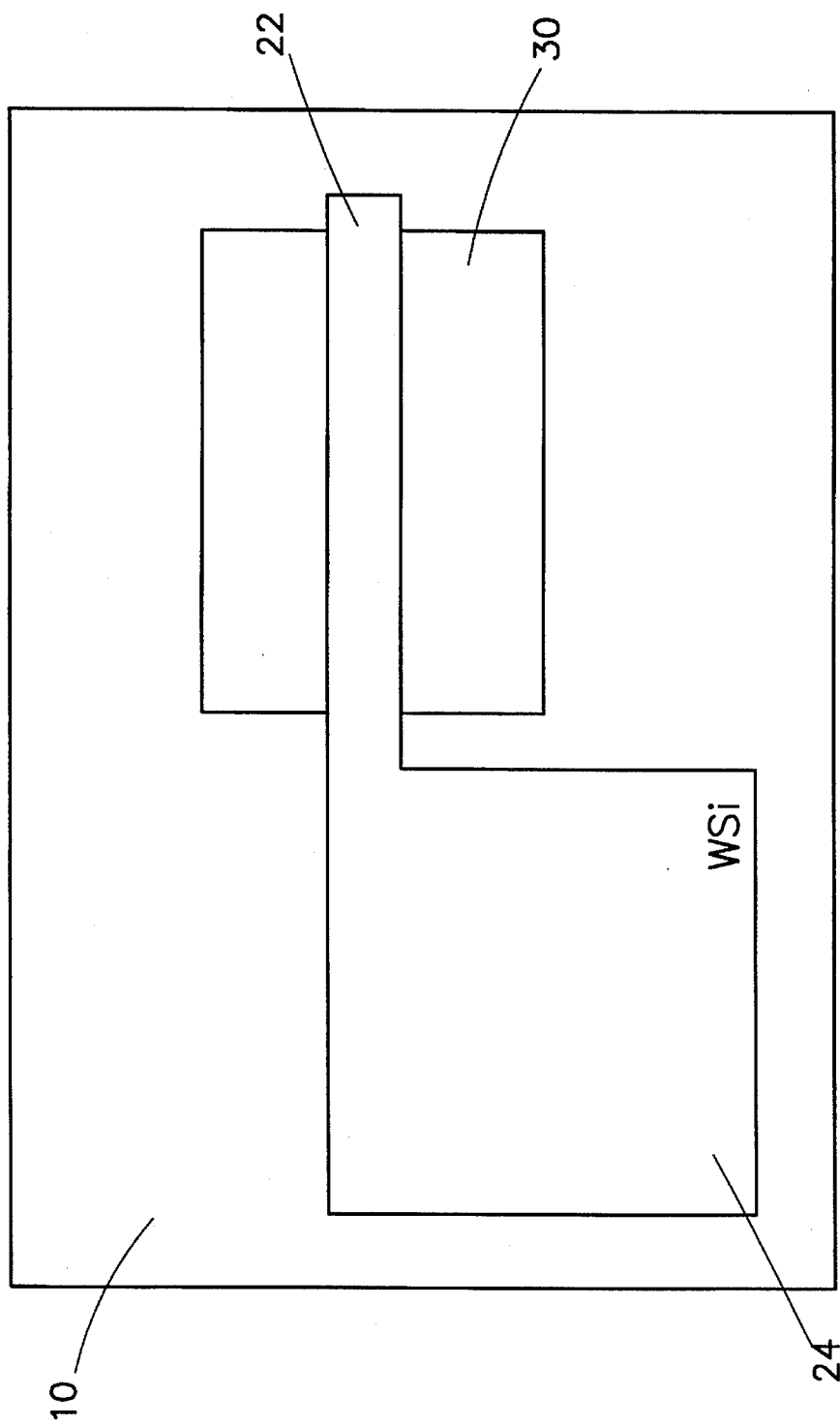
FIG. 2 is a plan view showing the gate finger and pad of a heterostructure FET.

In one method of HIGFET fabrication, heterostructure wafer 10 is covered with a layer 20 of gate metal, typically tungsten (W), and/or tungsten silicide (WSi), and/or tungsten nitride (WN). In FIG. 2, gate metal layer 20 is patterned and etched to form at least one gate finger 22, typically measuring 0.8 micron by 3 microns. Gate finger 22 extends over active region 30 of the FET, and a gate pad 24, typically measuring at least 5 microns by 5 microns, which allows an upper layer metal or wire to electrically contact gate finger 22. This configuration may be utilized in the present invention.

Figure 3:
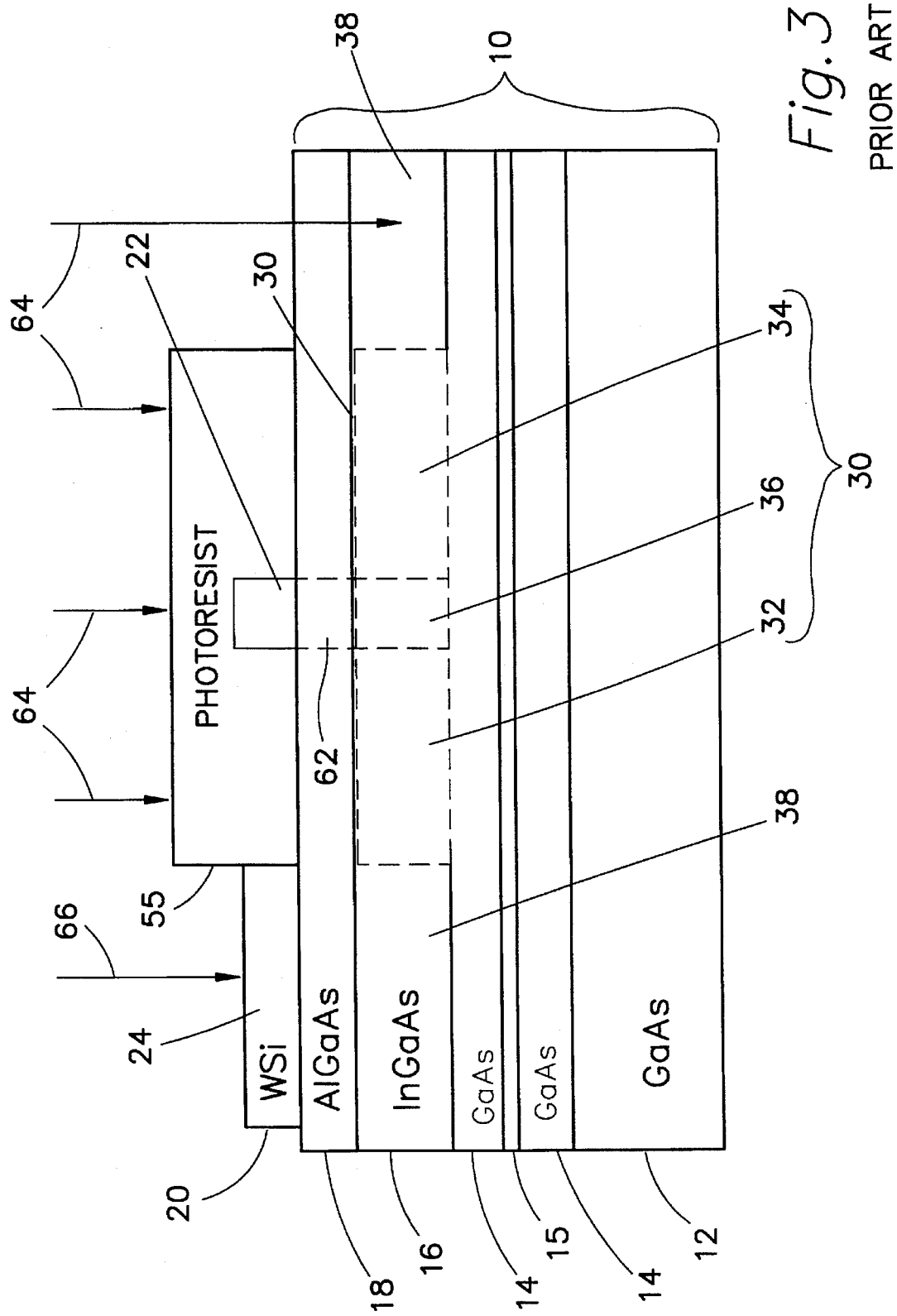
FIG. 3 is a cross-sectional view of a heterostructure FET having a thick gate metal layer of the related art.

In FIG. 3, after gate metal layer 20 has been patterned, an ion implantation step, prior to forming photoresist layer 55 but using a photoresist layer on wafer 10 that covers all of wafer 10 except for the area that subsequent photoresist layer 55 covers, is used to form source region 32 and drain region 34 for horizontal conduction in channel layer 38, and source and drain contacts, respectively, for vertical conduction in layer 18 of the FET in a manner known in the art (i.e., silicon ions for an N-channel FET and beryllium ions for a P-channel FET). Ohmic contacts (not shown) are formed on the source and drain contacts of layer 18, also typical in the related art. Gate finger 22 blocks ion implantation over a channel region 36 of the FET, so that region 36 is not affected by the implantation and region 62 remains an insulator for gate 22. Channel region 36 is self-aligned to implanted source region 32 and drain region 34.

Next, active FET region 30 is masked by a photoresist layer 55, and wafer 10 is bombarded with high energy ions, such as oxygen, hydrogen or argon ions. This step, known as ion isolation implantation 64 and 66, damages channel layer regions 38 around active region 30, rendering some of region 38 non conducting. Ion implantation makes regions of layers 18, 16, 15 and 14 more non conducting. This implantation electrically isolates the FET from adjacent devices on wafer 10.

However, the ion isolation implantation 66 does not penetrate the thickness of gate pad 24, so that the portion of channel layer 16 and/or 18 under gate pad 24 is not affected and thus not electrically isolated from pad 24. Because this portion of channel layer 16 remains conductive and pulse doped layer 15 remains conductive, there is significant parasitic capacitance between gate pad 24 of metal layer 20 and channel layer 16 underneath gate pad 24, with layer 18 functioning as the capacitance dielectric. While high capacitance per unit area between gate finger 22 and channel 36 permits fast operation of the FET, high capacitance between gate pad 24 and channel layer 16 slows down FET operation and is undesirable. A better process of FET fabrication is one which allows ion isolation implantation of the channel layer beneath gate pad 24 without reducing transistor quality or significantly increasing the number of steps in the fabrication sequence.

A fabrication method that solves the problem of gate pad 24 parasitic capacitance involves implanting the surface of the region of channel layer 16 beneath gate pad 24 before gate metal layer 20 is deposited. However, this method exposes wafer 10 to abuse and reduces the uniformity of structure and resulting performance among the produced HFETs. This is because the heterostructure wafer layers are very thin, and the removal of even a few atomic layers from heterostructure wafer 10 negatively affects the HFETs produced thereon. Any process step (e.g., cleaning) which occurs before deposition of gate metal layer 20 results in the removal of some material from the surface of heterostructure wafer 10. Therefore, deposition of gate metal layer 20, which protects the surface of heterostructure wafer 10, might best be kept as a step before ion isolation implantation 64 and 66 in the fabrication process, after growing the layers of heterostructure wafer 10.

Figure 4:
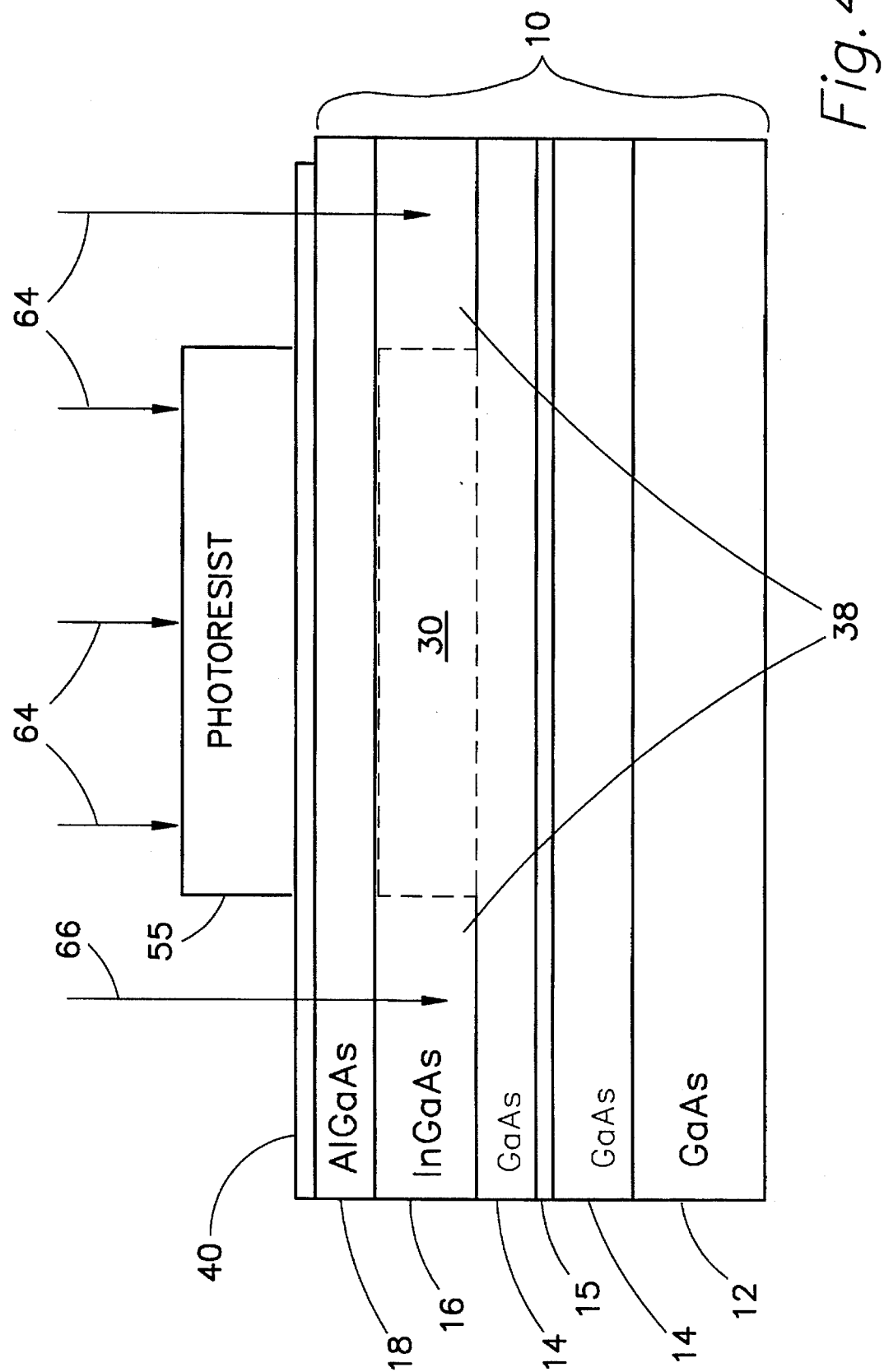
FIG. 4 is a cross-sectional view showing an ion implantation through a thin gate metal layer.

FIG. 4 illustrates the present method of fabrication. The layers of heterostructure wafer 10 are grown, and a gate metal (WSi) layer 40 is deposited. However, this gate metal layer 40 is very thin (200–500 angstroms) so that the ions in the ion isolation implantation 66 can pass through it. Thin gate metal layer 40 serves to protect the surface of heterostructure wafer 10 while still allowing ion implantation 64 and 66 of the wafer. In other words, layer 40 is thin enough to pass ions but thick enough to protect the surface of wafer 10. Incidentally, thin layer 40 may be used to form other circuit elements such as "thin film" resistors or "metal-insulator-metal" capacitors.

But prior to ion isolation implantation 64 and 66, photoresist layer 55 is deposited on gate metal layer 40 over active FET portion 30, and wafer 10 is implanted with ions. After implantation, channel layer regions 38 and pulse doped regions 15 which are not underneath photoresist layer 55 are damaged and therefore non conducting so as to prevent layer 18 being a parasitic capacitor in conjunction with metal layer 40.

Figure 5:
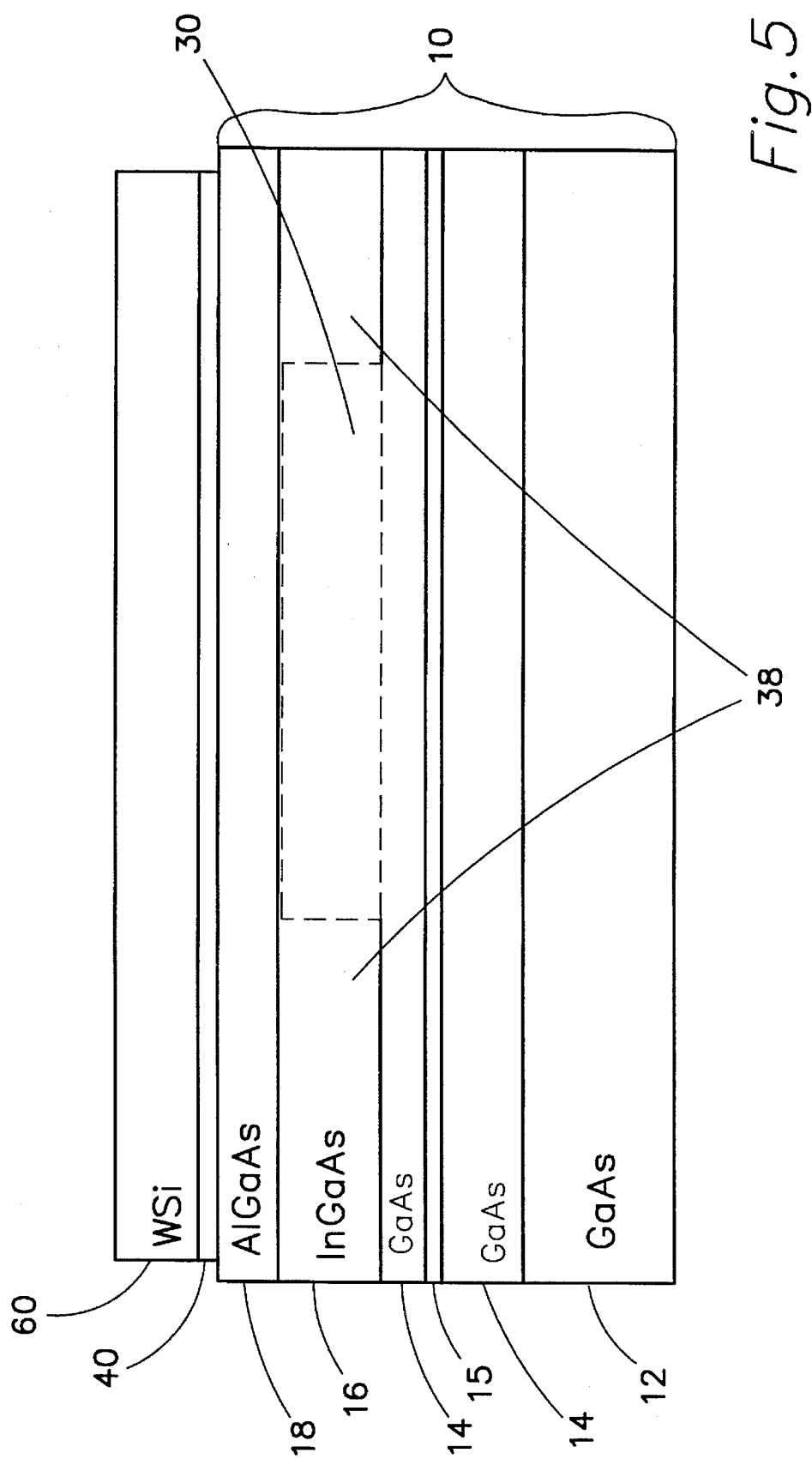
FIG. 5 is a cross-sectional view revealing a plurality of gate metal layers.

As shown in FIG. 5, photoresist layer 55 is removed after the ion implantation. An additional gate metal layer 60 of WSi, at a thickness of 3500–3800 angstroms, is then deposited. This brings the total thickness of gate metal layers 40 and 60 to approximately 4000 angstroms, a thickness which provides sufficient gate conductivity for efficient operation of the FET. This minimum gate metal thickness is determined by the resistance of the gate finger; too much resistance means slow operation.

By comparing FIG. 5 with FIG. 3, it may be noted that at this point the wafer configurations are essentially the same, except that all of channel layer regions 38 outside active area 30 have been implant isolated. After deposition, combined gate metal layers 40 and 60 are fashioned into a gate pad 24 and a gate finger 22, like those of FIG. 2. Further fabrication may be conventional.

I claim:

1. A heterostructure field effect transistor, having minimal parasitic gate capacitance between a gate and a heterostructure of the transistor, comprising:

a semi-insulating GaAs substrate;

a first GaAs buffer layer formed on said semi-insulating GaAs substrate;

a pulsed doped layer situated on said first GaAs buffer layer;

a second GaAs buffer layer situated on said pulsed doped layer;

an InGaAs channel layer formed on said second GaAs buffer layer, said InGaAs channel layer having source, gate, drain and insulation regions, the insulation region formed by an ion isolation implantation;

an AlGaAs insulator layer formed on said InGaAs channel layer;

a first metal gate pad and finger layer having a pattern, formed on said AlGaAs insulator layer, the first metal gate finger situated directly over the gate region of said InGaAs channel layer, and the first metal gate pad situated directly over the insulation region of said InGaAs channel layer; and a second metal gate pad and finger layer having a pattern congruent to the pattern of said first metal gate pad and finger layer, said second metal gate pad and finger layer formed on said first metal gate pad and finger layer.

2. The transistor of claim 1 wherein:

said first and second GaAs buffer layers have a total thickness between 1000 and 10,000 angstroms;

said InGaAs channel layer has a thickness between 70 and 250 angstroms;

said AlGaAs insulator layer has a thickness between 100 and 500 angstroms; and said first metal gate pad and finger layer has a thickness between 200 and 500 angstroms; and said second metal gate pad and finger layer has a thickness between 3000 and 10,000 angstroms.

3. The transistor of claim 2 wherein said pulsed doped layer contains a fraction of a monolayer of silicon dopant embedded in an atomic layer having a dose from $1 \times 10^{11}$ to $1 \times 10^{12}$ silicon atoms per cm$^2$.

* * * * *